United States Patent
Li

(10) Patent No.: US 6,196,391 B1
(45) Date of Patent: Mar. 6, 2001

(54) ELECTROSTATIC DISCHARGE-FREE CONTAINER FOR INSULATING ARTICLES

(75) Inventor: Meng Chun Li, Taipei (TW)

(73) Assignee: Taiwan Semiconductor Manufacturing Company, Ltd, Hsin Chu (TW)

(*) Notice: Subject to any disclaimer, the term of this patent is extended or adjusted under 35 U.S.C. 154(b) by 0 days.

(21) Appl. No.: 09/488,428

(22) Filed: Jan. 20, 2000

(51) Int. Cl.[7] .................................................. B65D 85/00
(52) U.S. Cl. ............................ 206/719; 206/723; 206/454
(58) Field of Search .................................... 206/719, 722, 206/723, 724, 454, 449

(56) References Cited

U.S. PATENT DOCUMENTS

| | | | |
|---|---|---|---|
| 5,452,801 | * | 9/1995 | Horn ...................................... 206/454 |
| 5,743,409 | * | 4/1998 | Nakahara et al. .................... 206/710 |
| 5,904,251 | * | 5/1999 | Ogata et al. .......................... 206/454 |

* cited by examiner

Primary Examiner—Paul T. Sewell
Assistant Examiner—Shian Luong
(74) Attorney, Agent, or Firm—Tung & Associates

(57) ABSTRACT

An electrostatic discharge-free container for storing electrically insulating articles is provided. The container consists of a container body formed of a top lid, a bottom lid and four sidewall panels defining a cavity therein, the lids and the sidewall panels are formed of an electrically insulating material, such as a polymeric material. Inside the container, at least four support means are mounted on the bottom lid in a spaced-apart relationship. Each of the at least four support means has a base portion for engaging the bottom lid and a roller portion for rollingly engaging and supporting an electrically insulating article thereon. The base portion and the roller portion of the at least four support means are formed of an electrically conductive material such as a metal particle loaded plastic for electrical communication between the two portions and with a grounding wire. The present invention container further includes a grounding means for electrical communication with the grounding wire and for discharging electrostatic charge formed when the insulating article is rolled on the roller portion of the at least four support means. One example of the present invention electrostatic discharge-free container may be a reticle pod for storing quartz reticle plates, even though the present invention novel container is not limited to such application.

12 Claims, 2 Drawing Sheets

$d_1$ = 1 cm
$D$ = 5 cm
$X$ = 0.2286 cm for 5 inch reticle
$X$ = 0.6350 cm for 6 inch reticle

ELECTROSTATIC DISCHARGE-FREE CONTAINER FOR INSULATING ARTICLES

FIELD OF THE INVENTION

The present invention generally relates to a container for holding articles made of an electrically insulating material and more particularly, relates to a container that is electrostatic discharge-free (ESD-free) for storing articles made of an electrically insulating material for preventing ESD damage.

BACKGROUND OF THE INVENTION

In the semiconductor fabrication process, a square cross-sectional or rectangular cross-sectional container made of a plastic material is frequently used to transport articles. These articles may include silicon wafers, reticles or other substrates used for building IC devices. A reticle is a transparent ceramic substrate that is coated with a metallic layer forming a pattern for an electronic circuit. It is generally used in an imaging step during a photolithographic process wherein a pattern of a circuit is reproduced on the surface of an electronic substrate, i.e., on a wafer surface.

A reticle can be constructed of any suitable transparent ceramic materials. One of the most commonly used material is quartz or silicon dioxide. A quartz reticle can be readily coated with a chrome layer at selective areas to reproduce an electrical circuit. The chrome metal layer may be formed by either a pure chromium or a chromium alloy. During a photolithographic imaging process, a light source is projected from one side of the reticle that is coated with the pattern such that the pattern can be reproduced on the surface of a wafer which is positioned on the opposite side of the reticle. The pattern for the electronic circuit coated on the reticle is frequently laid out in a 533 magnification. The true dimensions of the electronic circuit reproduced on the wafer surface can be obtained by suitably adjusting the optical lenses situated between the reticle and the wafer. Metallic coatings other than chrome may also be coated on the surface of the reticle for the circuit lay-out. However, chrome has been found to be an ideal material for its appearance of a brownish tone and its ease of identification by human eyes.

In a semiconductor fabrication facility, static electricity or electrostatic discharge frequently develops on surfaces of articles made of insulating materials when they are touched or rubbed by other insulating materials such as insulating gloves. The electricity is produced based on a triboelectricity theory. The discharge of the static electricity to machines and to human operators can cause damages to semiconductor wafers and process tools. Sometimes, it may even cause injury to a machine operator. In a semiconductor fabrication facility, it is therefore necessary to control ESD by grounding the machines, by controlling the relative humidity, or by building walls and floor coverings with slightly conductive materials such that electrical charges can be routed to ground. When the triboelectricity is suitably controlled, the control of dust and particulate contamination is also enhanced. For instance, the metal racks, pipe lines, cabinets, cables and rails are normally grounded in a facility to an equal potential bar or to a planar ground. The metal pedestals of the raised floor are then connected to the planar ground under the raised floor. To further enhance ESD protection, the metal framework of the clean room wall systems are also connected to the planar ground. Air ionization systems are frequently installed at selected locations in a fabrication facility, to provide additional ESD control.

Despite the elaborate efforts spent in grounding process machines and various facilities, ESD damages still occur in a fabrication facility. A typical example is the occurrence of ESD when an insulating material is shipped or transported in a container made of another insulating material. For instance, when a reticle is transported from a storage facility to a photolithography machine in a container, i.e., a pod, that is normally constructed of a thermoplastic material. Since the reticle itself is an insulating material, i.e., a quartz or other silicon dioxide materials coated with a chrome coating, when the pod is handled by machine operators wearing insulating gloves, the static charge on the pod drastically increases due to friction generated between two insulating articles. Since the pod is not equipped with an anti-electrostatic device, high static electricity cumulates on the surface of the pod. For instance, it has been confirmed that the static electrical field generated on a pod surface increases from 0.1 KV/inch to nearly 15 KV/inch when a polycarbonate pod is rubbed with PVC gloves. Such a high static electricity build-up on the surface of the pod immediately causes an electrostatic discharge between the pod and the reticle contained therein. When ESD occurs between the pod and the reticle, the pattern on the reticle surface is usually damaged to such an extent that it can no longer be used for imaging. Conventional air ionization devices installed at a fabrication facility are not useful for preventing such ESD damages.

Others have proposed techniques for controlling or minimizing ESD damages to reticles carried in plastic containers. For instance, anti-electrostatic-type plastic materials, such as Bayon® has been used for the construction of the pod. However, due to its high cost, this type of anti-electrostatic plastic material cannot be widely utilized in a fabrication facility. Still others have proposed the use of gloves that are made of a conductive material such as Propex® so that the generation of electrostatic discharge can be avoided. The high cost of the Propex® gloves prohibits its broad usage in the processing industry.

In some of the newer models of the reticle pods, the internal moving parts are provided with ESD metal mask shield to eliminate electrostatic discharge. However, there are no provisions for preventing a stepper mask pick-up arm from generating ESD during its movement in picking up a reticle. For instance, one of such stepper mask arm 60 is shown in FIG. 3. During an attempt of the stepper mask arm 60 in picking up reticle 24, the bottom surface 26 of the reticle inevitably slides on the tips of pedestals 22, as shown in FIG. 1.

Referring initially to FIG. 1 where it is shown a cross-sectional view of a container equipped with a conventional reticle support system. The container 10 is constructed of a top lid 12, a bottom lid 14, a left sidewall 18 and a right sidewall 16. The front and rear sidewalls (not shown) are constructed of similar materials, i.e., a thermoplastic material such as polycarbonate or polymethylmethacrylate. Pedestals 22 are positioned on the bottom lid 14 of the container for supporting a reticle 24. The reticle 24 is normally constructed of a transparent ceramic material such as quartz or other types of silicon dioxide. On a surface 26 of the reticle 24, a pattern 28 is formed by coating the surface with a suitable metallic material. The pattern 28 can be formed by one of many suitable metallic materials. A handle 32 is affixed to the top lid 12 of the container 10 for easy carrying by an operator. The $d_2$ value for the commercially obtained container is 3.365 cm.

The scratching of the reticle surface 26 during its removal procedure from the pod 10 can cause a serious contamination problem. As shown in FIG. 2, a plane view of the reticle 34 with two alignment marks 20 situated in the surface 26. The position of the pedestals 22 for supporting the reticle 24 are shown in ghost lines. During the reticle removal process, the surface 26 is dragged on the tip of the pedestals 22 and therefore, not only the frictional force may cause scratching of the alignment marks 22 and thus cause misalignment, the frictional force on the surface 26 may also cause particle contamination from the reticle material. Moreover, electrostatic discharge may be generated by the friction between two electrically insulating articles, i.e., between the pedestal 22 and the quartz surface 26.

It is therefore an object of the present invention to provide an electrostatic discharge-free container for holding insulating articles that does not have the drawbacks or shortcomings of the conventional containers.

It is another object of the present invention to provide an electrostatic discharge-free container for holding insulating articles that is provided with support means for supporting the insulating articles thereon and for preventing ESD when the article is moved on the support means.

It is a further object of the present invention to provide an electrostatic discharge-free container for holding insulating articles that utilizes support means constructed by a support base and a roller.

It is another further object of the present invention to provide an electrostatic discharge-free container for holding insulating articles that utilizes support means which are fabricated of electrically conductive materials.

It is still another object of the present invention to provide an electrostatic discharge-free container for holding insulating articles that utilizes support means for the insulating article that are fabricated of electrically conductive material and are grounded by a grounding wire.

It is yet another object of the present invention to provide an electrostatic discharge-free container for holding insulating articles that is capable of preventing scratching of the article when it is moved on a support pedestal.

It is still another further object of the present invention to provide an electrostatic discharge-free container for holding insulating articles that utilizes roller support means for preventing scratching of the article surface and resulting particle contamination in the container.

SUMMARY OF THE INVENTION

In accordance with the present invention, an electrostatic discharge-free container for holding an electrically insulating article is provided.

In a preferred embodiment, an electrostatic discharge-free container for storing insulating articles is provided which includes a container body constructed of a top lid, a bottom lid and four sidewall panels forming a cavity therein, one of the four sidewall panels allows access to the cavity, the top lid, the bottom lid and the four sidewall panels are made of an electrically insulating material, at least four support means mounted on the bottom lid in a spaced-apart relationship, each of the at least four support means has a base portion for engaging the bottom lid and a roller portion for rollingly engaging and supporting an electrically insulating article thereon, the base portion and the roller portion of the at least four support means are formed of an electrically conductive material for electrical communication between the two portions and with a grounding wire, and a grounding means for electrical communication with the grounding wire and for discharging an electrostatic charge formed when the insulating article is moved on the roller portion of the at least four support means.

In the electrostatic discharge-free container for insulating articles, the container may be a reticle pod. The top lid, bottom lid and four sidewall panels may be formed of a plastic material that is electrically non-conductive. The at least four support means may be positioned juxtaposed to four corners of the container. The base portion and the roller portion may be assembled together by a shaft through the roller portion, the shaft provides electrical communication between the roller portion and the base portion. The base portion and the roller portion may be formed of an electrically conductive polymeric material. The insulating articles stored in the container may be a chrome coated quartz reticle plate.

In another preferred embodiment, a reticle pod for storing a quartz reticle plate is provided which includes a pod body formed of a top lid, a bottom lid and four sidewall panels forming a cavity therein, the top lid, bottom lid and four sidewall panels are made of an electrically insulating material, four support means mounted on the bottom lid in a spaced-apart relationship each juxtaposed to a corner of the pod body, each of the four support means is formed of a support base for mounting to the bottom lid and a roller for engaging and supporting the quartz reticle plate, the support base and the roller are made of an electrically conductive material for providing electrical communication thereinbetween, and a grounding means for electrical communication with the support base and for discharging an electrostatic charge generated when the quartz reticle plate rollingly engages the rollers on the four support means.

In the reticle pod for storing a quartz reticle plate, the top lid, the bottom lid and the four sidewall panels may be formed of a plastic material that is electrically non-conductive. The support base and the roller may be formed of an electrically conductive polymeric material. The roller rollingly engages the support base through a shaft, the shaft provides electrical communication between the support base and the roller. The quartz reticle plate may have a chrome pattern formed thereon.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an electrostatic discharge-free container for storing electrically insulating articles. In one example, a reticle pod is provided for holding quartz reticle plates therein without producing electrostatic discharge.

The present invention electrostatic discharge-free container for storing insulating articles can generally be provided in a container body which is constructed by a top lid, a bottom lid and four sidewall panels to form a cavity therein. One of the four sidewall panels allows access to the cavity while the lids and the sidewall panels are made of an electrically insulating material, such as a polymeric material. Inside the container body, at least four support means are provided which are mounted on the bottom lid in a spaced-apart relationship. Each of the support means is formed with a base portion for engaging the bottom lid and a roller portion for rollingly engaging and supporting an electrically insulating article thereon. The base portion and the roller portion of the at least four support means may be formed of an electrically conductive material for electrical communication between the two portions and with a grounding wire such that a grounding means can be used for electrical communication with the grounding wire and for discharging an electrostatic charge formed when the insulating article is moved on the roller portions of the at least four support means.

In another embodiment, a reticle pod for storing a quartz reticle plate therein is provided which includes a pod body formed of a top lid, a bottom lid and four sidewall panels enclosing a cavity therein. The lids and the sidewall panels are made of an electrically insulating material such as a plastic. Inside the pod body, four support means are provided which are mounted on the bottom lid in a spaced-apart relationship. Each of the support means is mounted juxtaposed to a corner of the pod body and formed of a support base for mounting to the bottom lid and a roller for engaging and supporting the quartz reticle plate. The support base and the roller are made of an electrically conductive material for providing electrical communication thereinbetween. The pod body further includes a grounding means for electrical communication with the support base for discharging an electrostatic charge generated when the quartz reticle plate is moved on the rollers of the support means. The roller may rollingly engage the support base through a shaft member which provides electrical communication between the support base and the roller.

Figure 3:
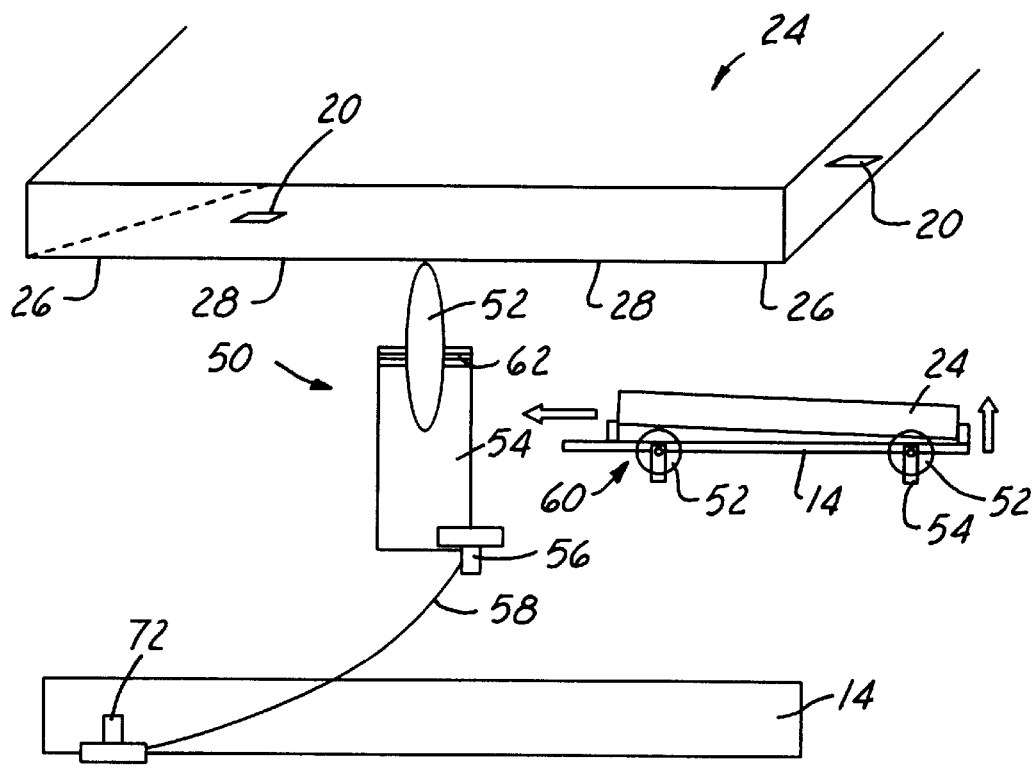
FIG. 3 is an illustration showing a cross-sectional view of the present invention support means in relation to a bottom lid of a pod and a reticle plate supported thereon.
Figure 4:
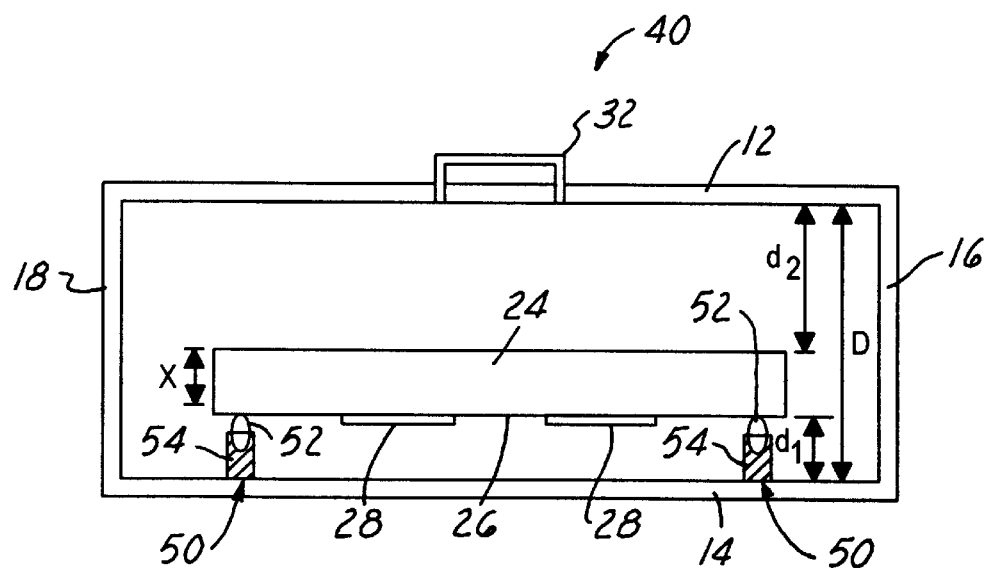
FIG. 4 is a cross-sectional view of the present invention reticle pod equipped with the roller support system for supporting a reticle plate thereon.

Referring now to FIG. 3 wherein a present invention support means 50 is shown in relation to a reticle plate 24 and a bottom lid 14 of the reticle pod 40 (shown in FIG. 4). The support means 50 is constructed of two main parts, i.e., the support base 54 and the roller 52 which is mounted on the top of the support base 54. The roller 52 is mounted to the support base 54 through a shaft member 62 which further provides electrical communication between the roller 52 and the base 54 by providing both in electrically conductive material. A suitable material for use in such application may be a metal particle loaded polymeric material which exhibits good electrical conductivity properties. For instance, different types of thermoplastic materials may be loaded with carbon black to achieve electrical conductivity.

The support means 50 further includes a grounding means 56 which is attached to the base portion of the support means and connected to a grounding point 72 on the bottom lid 14 of the reticle pod through a grounding wire 58.

Figure 1:
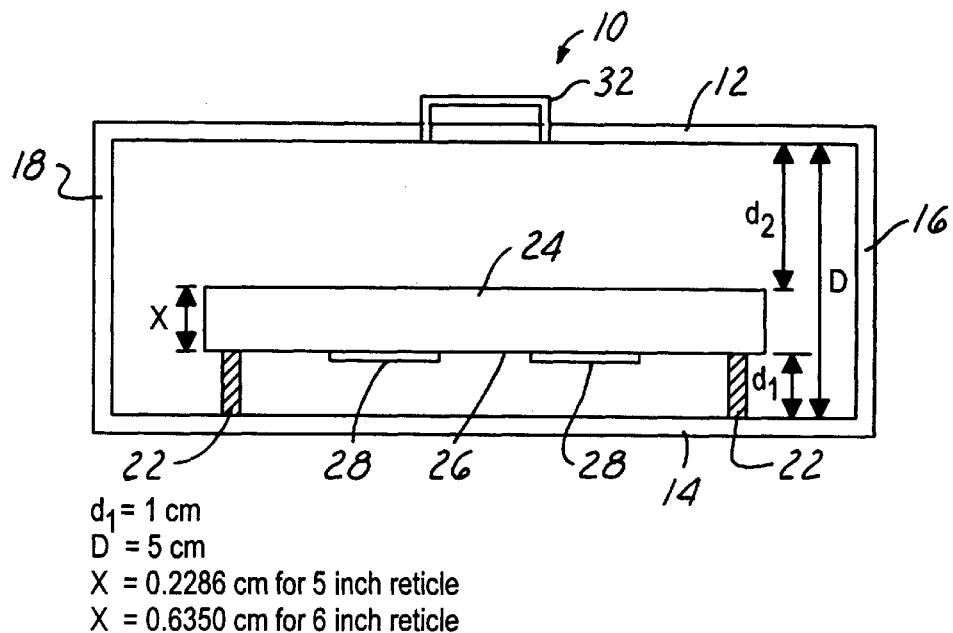
FIG. 1 is an illustration showing a cross-sectional view of a conventional reticle pod with a pedestal support system.
Figure 2:
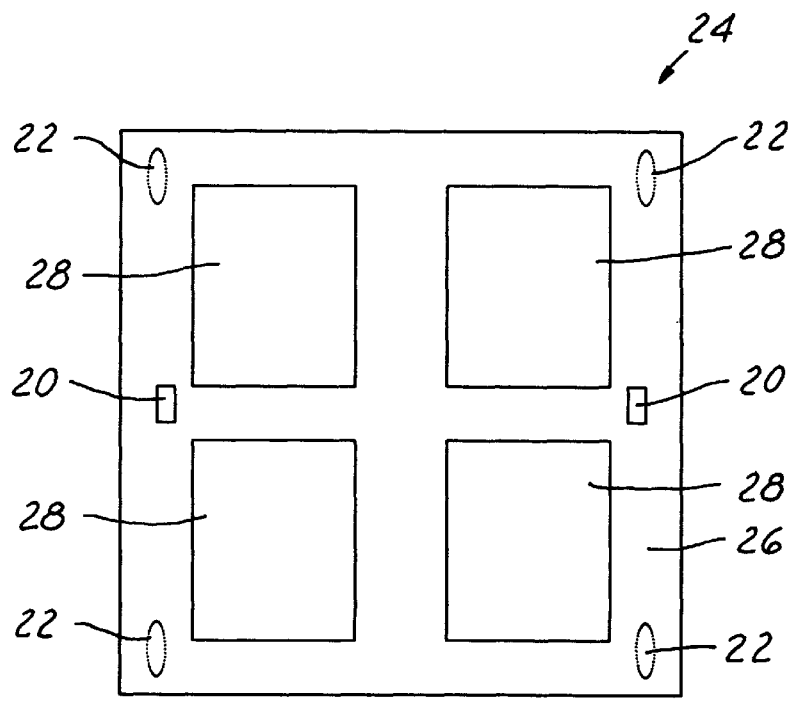
FIG. 2 is a plane view of a conventional reticle having chrome patterns and alignment marks formed thereon.

As shown in FIG. 3, the tip of the roller 52 supports the bottom surface 26 of the reticle plate 24 either inbetween the chrome patterns 28 or, more likely, along the outer periphery of the reticle plate 24, as shown in FIG. 4. The major benefits made possible by the present invention novel support means utilized in the reticle pod is therefore self-evident by an inspection of FIGS. 3 and 4. First, the roller 52 prevents any scratching of the bottom surface 26 of the reticle plate 24 and thus, eliminates any possibility of particle contamination. Secondly, the roller 52 rolls smoothly along the edge portion of the reticle plate 24, as shown in FIG. 2, such that even when rolled over the alignment marks 20, it does not damage the alignment marks 20. This eliminates any possibility of misalignment due to damaged alignment marks and furthermore, any possibility of intrafield magnification error due to reticle leveling problems.

Thirdly, and most importantly, the present invention novel support means 50 prevents the generation of any electrostatic discharge due to the rolling action between roller 52 and surface 26 of the reticle plate 24. Even when a small amount of electrostatic electricity may be generated between the roller and the surface, such electricity is immediately discharged through the electrically conductive material used in the roller 52, in the support base 54 through the grounding wire 58. The present invention novel reticle pod that contains the novel support means 50 therefore prevents any occurrence of electrostatic discharge and thus any damages to the reticle pattern due to such discharge.

The present invention novel electrostatic discharge-free container for storing insulating articles has therefore been amply described in the above descriptions and in the appended drawings of FIGS. 3 and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An electrostatic discharge-free container for insulating articles comprising:
   a container body constructed of a top lid, a bottom lid and four sidewall panels forming a cavity therein, one of said four sidewall panels allows access to said cavity, said top lid, said bottom lid and said four sidewall panels being formed of an electrically insulating material,
   at least four support means mounted on said bottom lid in a spaced-apart relationship, each of said at least four support means having a base portion for engaging said bottom lid and a roller portion for rollingly engaging and supporting an electrically insulating article thereon, said base portion and said roller portion of said at least four support means being formed of an electrically conductive material for electrical communication between said two portions and with a grounding wire, and
   a grounding means for electrical communication with said grounding wire and for discharging an electrostatic charge formed when said insulating article being rolled on said roller portions of said at least four support means.

2. An electrostatic discharge-free container for insulating articles according to claim 1, wherein said container being a reticle pod.

3. An electrostatic discharge-free container for insulating articles according to claim 1, wherein said top lid, said bottom lid and said four sidewall panels being formed of a plastic material that is electrically non-conductive.

4. An electrostatic discharge-free container for insulating articles according to claim 1, wherein said at least four support means being positioned juxtaposed to four corners of said container.

5. An electrostatic discharge-free container for insulating articles according to claim 1, wherein said base portion and said roller portion being assembled together by a shaft portion through said roller portion, said shaft portion provides electrical communication between said roller portion and said base portion.

6. An electrostatic discharge-free container for insulating articles according to claim 1, wherein said base portion and said roller portion being formed of an electrically conductive polymeric material.

7. An electrostatic discharge-free container for insulating articles according to claim 1, wherein said insulating article stored in said container being a chrome coated quartz reticle plate.

8. A reticle pod for storing a quartz reticle plate comprising:
- a pod body formed of a top lid, a bottom lid and four sidewall panels forming a cavity therein, said top lid, bottom lid and four sidewall panels being made of an electrically insulating material,
- four support means mounted on said bottom lid in a spaced-apart relationship each juxtaposed to a corner of said pod body, each of said four support means being formed of a support base for mounting to said bottom lid and a roller for engaging and supporting said quartz reticle plate, said support base and said roller being made of an electrically conductive material for providing electrical communication thereinbetween, and
- a grounding means for electrical communication with said support base and for discharging an electrostatic charge generated when said quartz reticle plate rollingly engages said rollers on said four support means.

9. A reticle pod for storing a quartz reticle plate according to claim 8, wherein said top lid, said bottom lid and said four sidewall panels being formed of a plastic material that is electrically non-conductive.

10. A reticle pod for storing a quartz reticle plate according to claim 8, wherein said support base and said roller being formed of an electrically conductive polymeric material.

11. A reticle pod for storing a quartz reticle plate according to claim 8, wherein said roller rollingly engages said support base through a shaft, said shaft provides electrical communication between said support base and said roller.

12. A reticle pod for storing a quartz reticle plate according to claim 8, wherein said quartz reticle plate having a chrome pattern formed thereon.

* * * * *